United States Patent [19]

Tanaka et al.

[11] Patent Number: 5,142,420
[45] Date of Patent: Aug. 25, 1992

[54] SAMPLING FREQUENCY REPRODUCTION SYSTEM

[75] Inventors: Hiroshi Tanaka, Kadoma; Tetsuo Ishiwata, Suita; Eiji Yamauchi, Katano, all of Japan

[73] Assignee: Matsushita Electric Industrial Co., Ltd., Osaka, Japan

[21] Appl. No.: 512,998

[22] Filed: Apr. 23, 1990

[30] Foreign Application Priority Data

Apr. 28, 1989 [JP] Japan .................. 1-109412
Nov. 10, 1989 [JP] Japan .................. 1-291229

[51] Int. Cl.⁵ .............................................. G11B 5/09
[52] U.S. Cl. ................................. 360/32; 360/51
[58] Field of Search ......................... 360/32, 51, 64

[56] References Cited

U.S. PATENT DOCUMENTS 4,780,759 10/1988 Matsushima et al. .

FOREIGN PATENT DOCUMENTS 61-233472 10/1986 Japan .
62-162280 7/1987 Japan .
63-29377 2/1988 Japan .

OTHER PUBLICATIONS

J. M. Bryant, "Digital frequency synthesizer design", Wireless World, pp. 62-64, 83, Jun. 1982 London.
Friedrich Vieweg & Sohn, Brunswick/Wiesbaden, "Einfuhrung in die PLL-Technik", Horst Geschwinde, second edition, pp. 3, 4, 1980.

Primary Examiner—Vincent P. Canney
Attorney, Agent, or Firm—Stevens, Davis, Miller & Mosher

[57] ABSTRACT

A phase locked loop is disclosed in which a digital audio signal is recorded in synchronism with a video signal and a sampling frequency of the digital audio signal is reproduced in reproduction mode. A frequency divider of the phase locked loop comprising a phase comparator a low-pass filter, a VCO and a frequency divider unit is switched by the number of the digital audio signal recorded for each vertical sync period (or 1/N thereof) of the video signal, so that a sampling frequency of the digital audio signal having no relationship of integral ratio with a vertical sync frequency Fv of the video signal is reproduced from the same frequency Fv. The reference input to the phase comparator is delayed by a predetermined time in accordance with the number of the digital audio signal, with the result that the sampling frequency reproduced has no period error to the extent that the reference input has no period error.

6 Claims, 9 Drawing Sheets

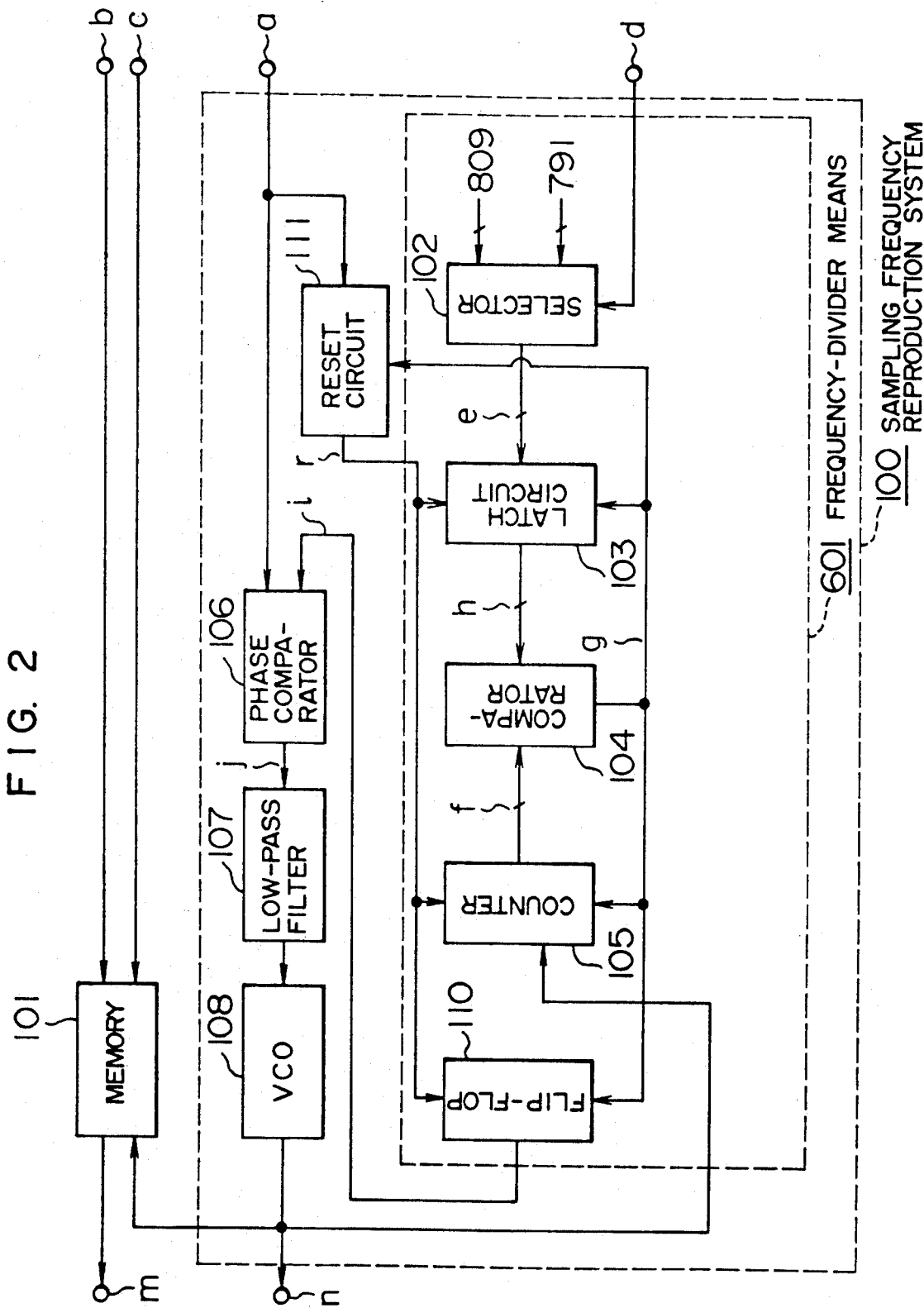

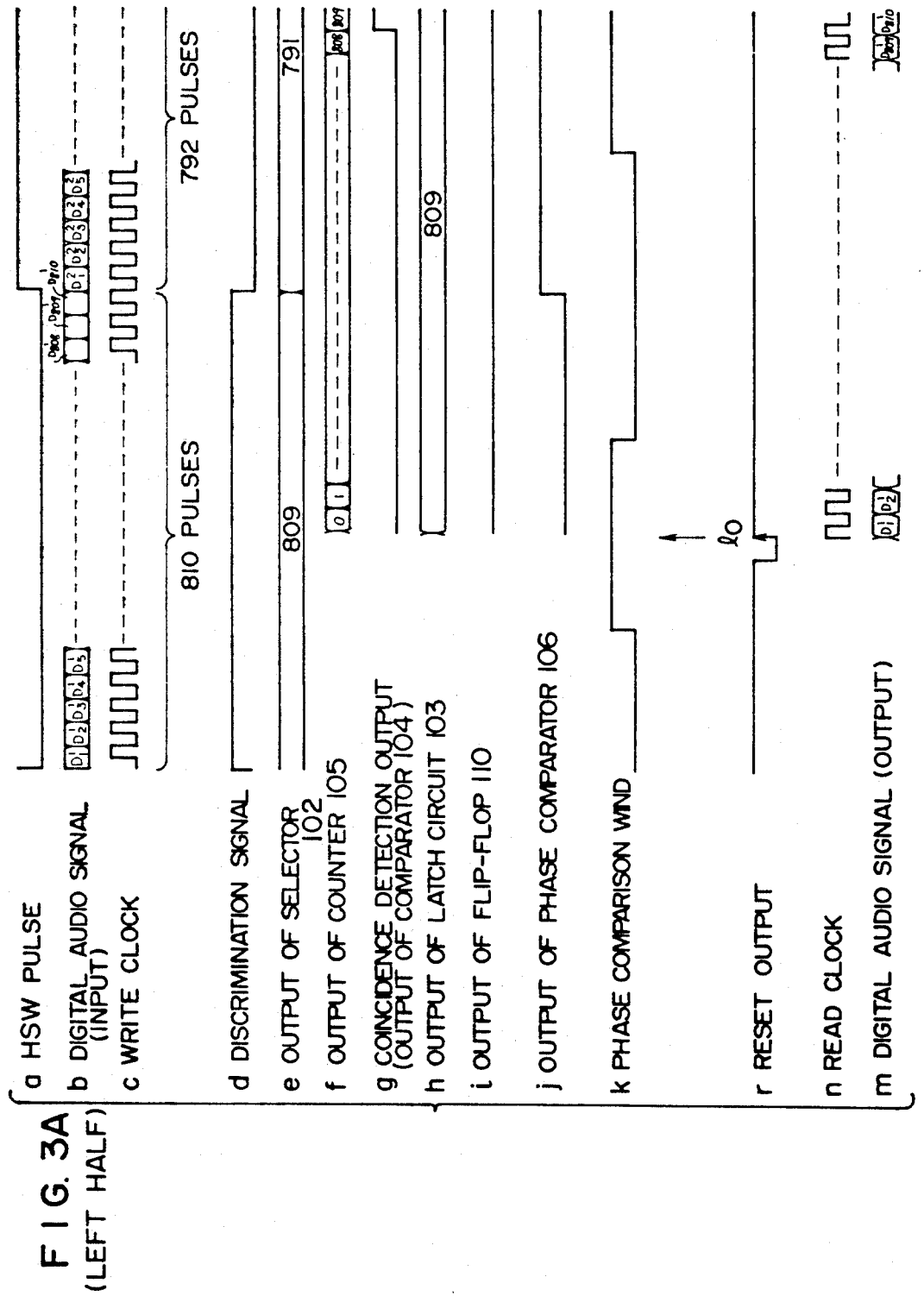

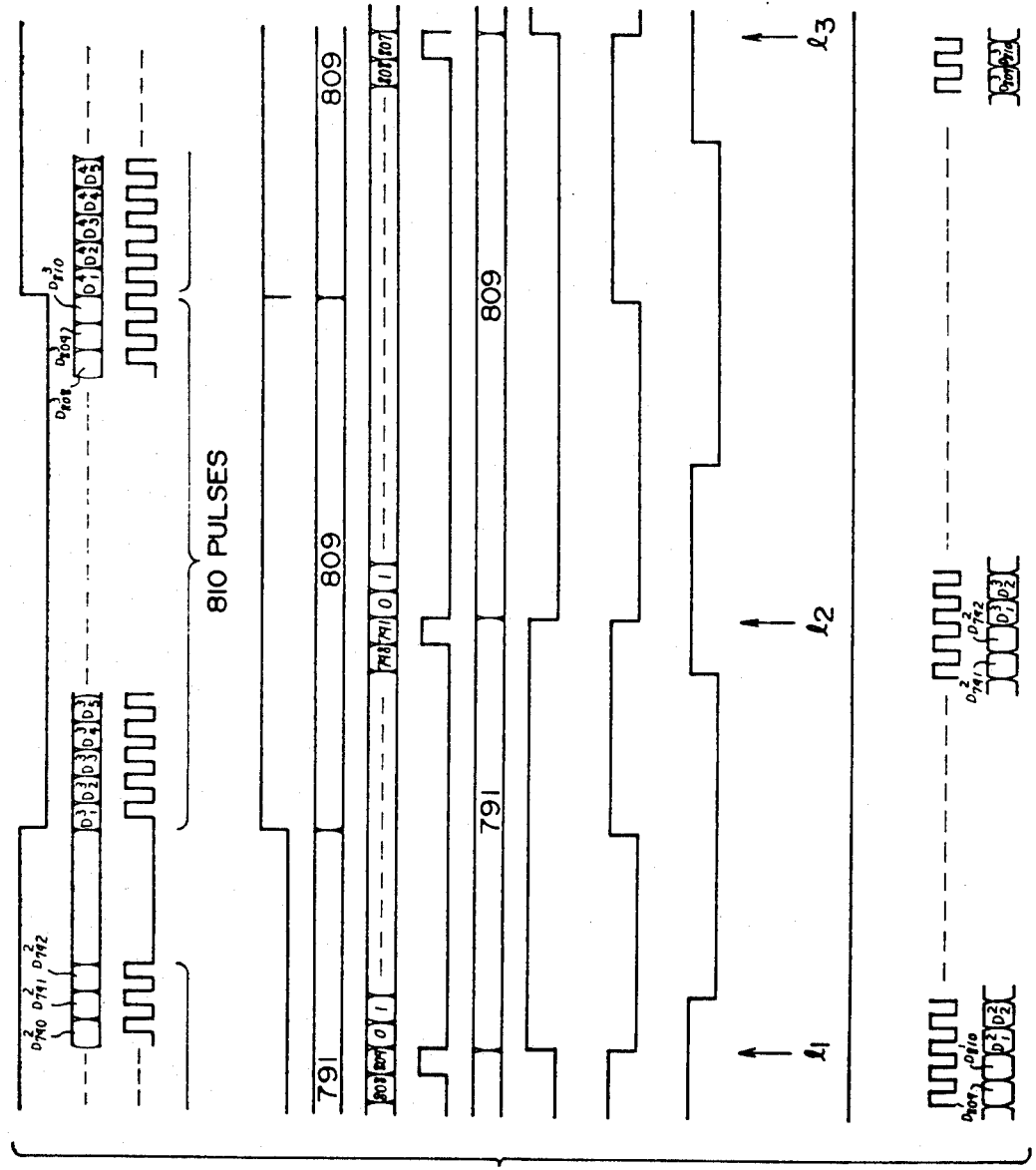
FIG. 3B (RIGHT HALF)

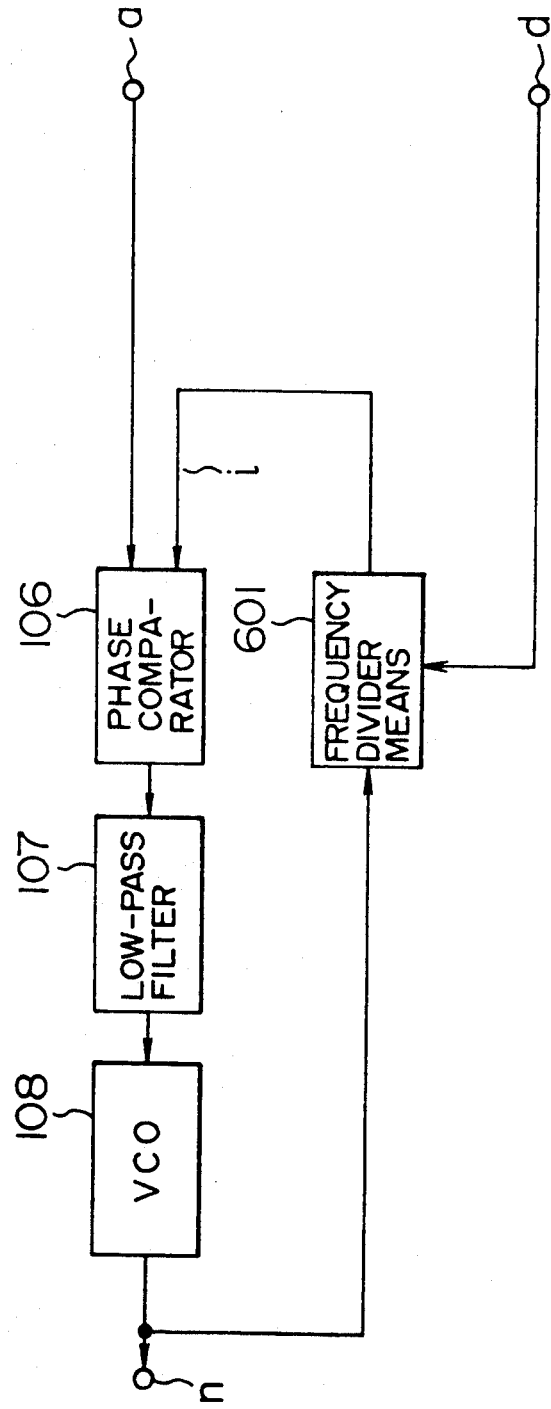

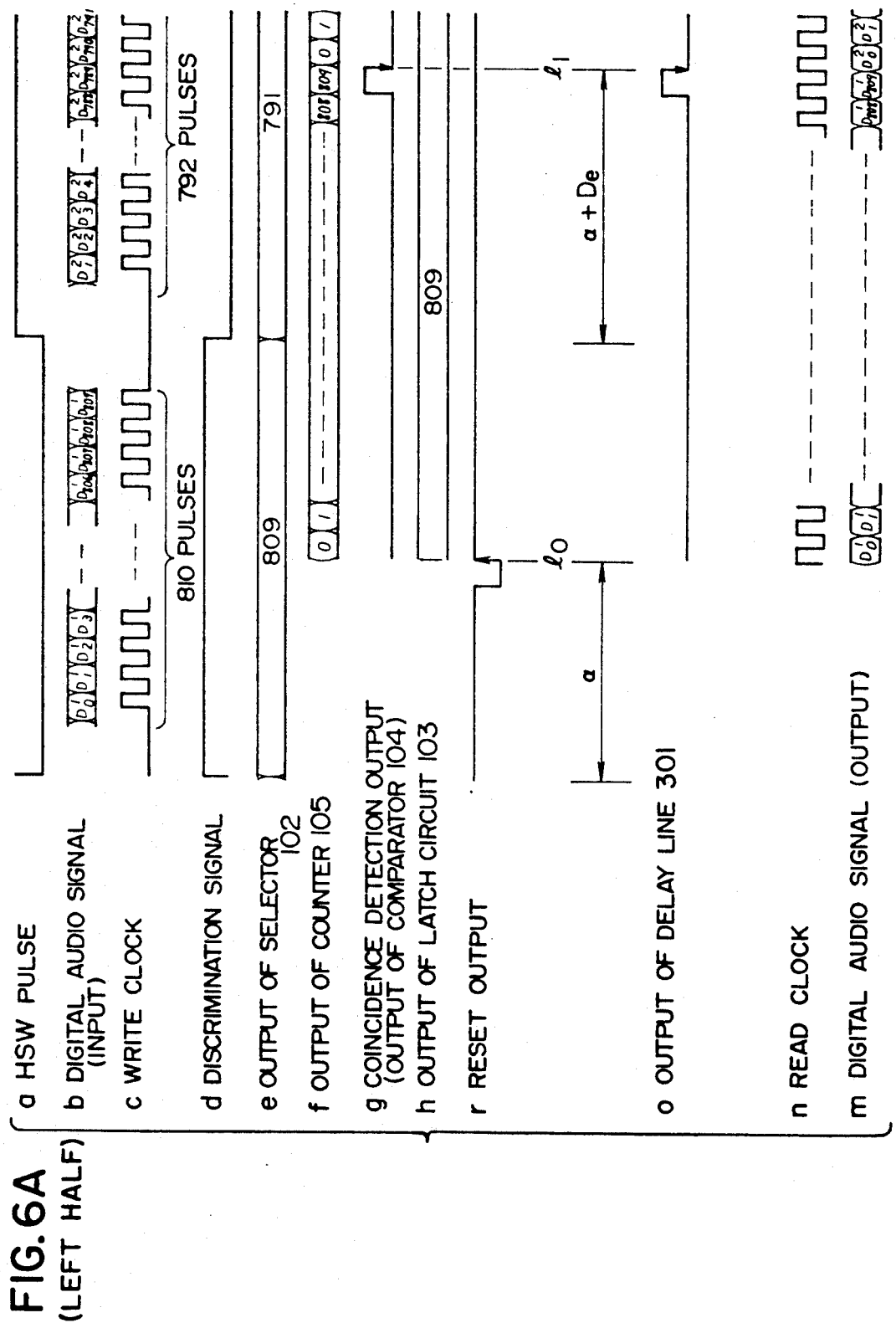
FIG. 6A (LEFT HALF)

(RIGHT HALF)

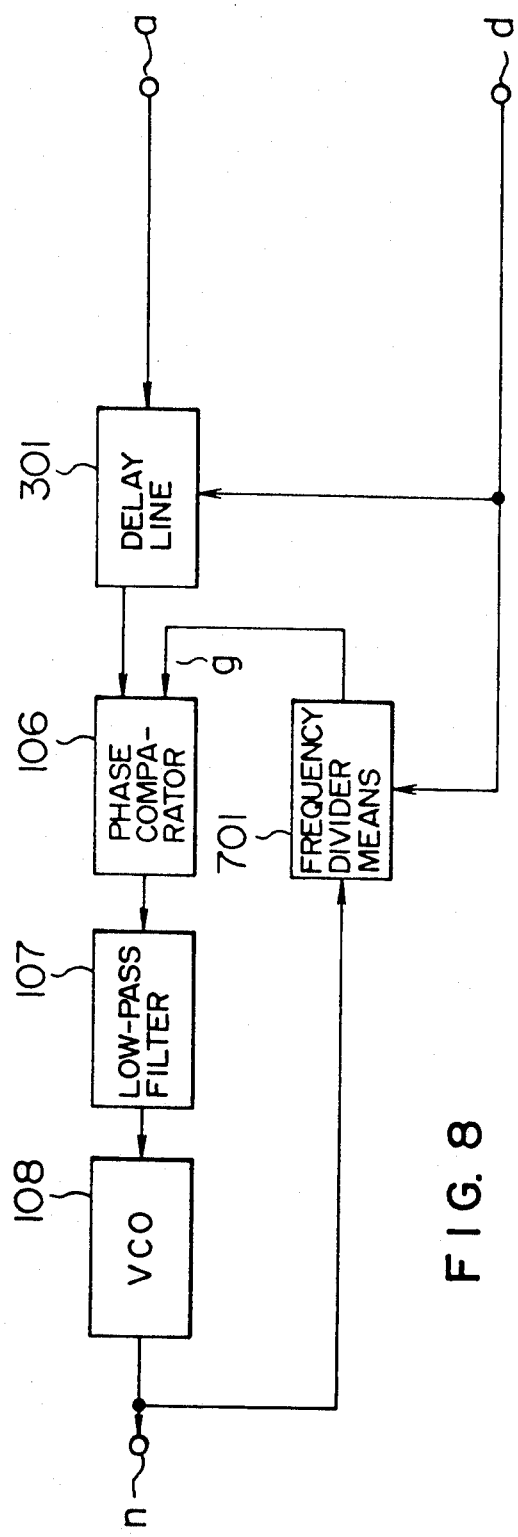
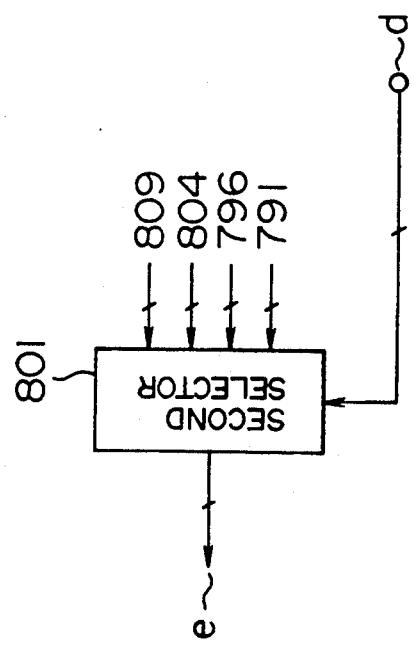

SAMPLING FREQUENCY REPRODUCTION SYSTEM

BACKGROUND OF THE INVENTION

1. Field of the Invention

The present invention relates to a phase locked loop system for transmitting a digital audio signal in synchronism with a video signal and then reproducing the sampling frequency of the digital audio signal.

2. Description of the Prior Art

In recording a digital audio signal by a helical scan VTR, the configuration of the VTR servo system synchronous with the vertical sync signal of the video signal generally requires the digital audio signal to have a sampling frequency of 31.968 kHz, 44.056 kHz or 47.952 kHz in synchronism with the vertical sync signal (60/1.001 Hz for NTSC system) of the video signal.

When a digital audio signal is recorded from a digital interface by the helical scan VTR in this configuration, it is necessary for the transmitting end of the digital audio signal to receive the sync clock from the VTR and transmit a digital audio signal in synchronism therewith.

Recording is, therefore, impossible from a digital audio tape recorder exclusively used for audio purposes lacking an external sync input or a digital audio unit operated with a specific sampling frequency (32 kHz, 44.1 kHz or 48 kHz, for example).

There has been proposed a digital signal processing system for synchronizing a digital audio signal of a sampling frequency Fs with a vertical sync frequency Fv of a video signal non-synchronous with the frequency Fs and recording/reproducing it together with a video signal on a helical-scan VTR (JP-A-61-233472, JP-A-62-162280, JP-A-63-29377).

This system records a digital audio signal in a plurality of sections in the number of [Fs/Fv]+A or [Fs/Fv]−B for each head-switching period. The digital audio signal thus recorded is controlled to an average output sampling rate Fs. When Fs=48 kHz, Fv=60/1.001 Hz, A=10 and B=8, for example, the digital audio signal pulses or samples numbering 810 or 792 for the head switching period are recorded by being controlled to an average of 800.8. In the head-switching period for recording 792 digital audio signal samples, 18 dummy data samples are recorded together with them to match the output rate with the output of 810 digital samples for the head-switching period. Also, when the 810 or 792 data pulses are produced in the head-switching period, a discrimination signal is recorded for discriminating the number of the digital audio signal pulses recorded during the head-switching period.

FIG. 1 shows a conventional digital signal processing system, in which numeral 501 designates a digital audio signal input terminal, numeral 502 a time-axis conversion circuit, numeral 503 an encoding circuit, numeral 504 a format control circuit, numeral 505 a modulation circuit, numeral 506 a recording amplifier, numeral 507 a pair of magnetic heads mounted on a rotary cylinder, numeral 508 a reproduction amplifier, numeral 509 a demodulation circuit, numeral 510 a reverse format control circuit, numeral 511 a decoding circuit, numeral 512 a reverse time-axis conversion circuit, numeral 513 a digital audio signal output terminal, numeral 515 a switch, and numeral 516 a switching signal generator (head switch (HSW generator).

The operation of a conventional digital signal system will be explained with reference to FIG. 1.

First, in recording mode, the HSW generator 516 generates a clock of 30/1.001 Hz (HSW pulses) synchronous with the vertical sync signal of the video signal. The input digital audio signal is applied through the input terminal 501 to the time-axis conversion circuit 502. The time-axis conversion circuit 502 produces the digital audio signal divided into a plurality of sections numbering [Fs/Fv]+A or [Fs/Fv]−B for each head-switching period (vertical sync period of video signal) with reference to the HSW pulse. The digital audio signal produced is controlled to have an average of Fs/Fv pulses in number for each head-switching period. When Fs=48 kHz, Fv=60/1.001 Hz, A=10 and B=8, for example, the digital audio signal is controlled to have 810 or 792 pulses for a head-switching period. In a head-switching period when 792 digital audio signal pulses are produced, 18 dummy data sample pulses are produced at the same time to match the 810 pulses of the head-switching period with the output rate. At the time of producing 810 or 792 digital audio sample pulses in a head-switching period, a discrimination signal is produced for discriminating the number of digital audio signals produced during the head-switching period. The encoding circuit 503 receives an output of the time-axis conversion circuit 502 and adds thereto a predetermined data interleave and an error-correcting redundant data. The format control circuit 504 is supplied with an output data from the encoding circuit 503 and adds thereto a header word including a sync signal, an ID code, a block address, etc. for each predetermined data block. This circuit 504 is also supplied with the discrimination signal and adds it to the header word. The modulation circuit 505 is supplied with an output from the format control circuit 504 and after subjecting it to a predetermined data modulation, records in the magnetic tape through the recording amplifier 506 and the magnetic head 507.

In reproduction mode, on the other hand, the reproduction output of the format control circuit 504 produced through the magnetic head 507, the reproduction amplifier 508 and the demodulation circuit 509 is applied to the reverse format control circuit 510. The reverse format control circuit 510 detects the header word and generates a timing signal for the predetermined data block. Also, the circuit 510 reproduces the discrimination signal for discriminating the number of the digital audio sample pulses produced during the head-switching period by detecting the discrimination signal in the header word. The decoding circuit 511 effects the de-interleave process reverse to the interleave process effected in the encoding circuit 503, or an error-correcting decoding process, and produces 810 or 792 digital audio sample pulses for each head-switching period. The reverse time axis-conversion circuit 512 is supplied with the discrimination signal and the output of the decoding circuit 511 produced in the form of digital audio sample pulses in the number of 810 or 792 for each head-switching period, and produces a digital audio signal of 48 kHz in sampling frequency.

In this conventional method, digital audio sample pulses in the number of 810 or 792 are produced in the number of 800.8 on the average for each head-switching period and stored in memory to be read by a clock of Fs =48 kHz in reproduction mode. No method of generating the timing clock of Fs=48 kHz required for this prior art process has been proposed to date.

SUMMARY OF THE INVENTION

Accordingly, the object of the present invention is to provide a sampling frequency reproduction system for generating a sampling frequency Fs of a digital audio signal from the vertical sync period of a video signal or the head-switching period, neither of which have a relationship in an integral ratio with Fs.

In order to achieve the aforementioned object, there is provided according to one aspect of the present invention a sampling frequency reproduction system comprising phase comparator means supplied with a reference signal and an output of a frequency divider for producing the phase difference between them as a phase error signal, band-limiting means for limiting the frequency band of the phase error signal, voltage-controlled oscillator means for controlling the oscillation frequency of a clock produced by the output of the band-limiting means, and frequency divider means for dividing by a predetermined number and producing the clock, wherein the frequency divider means is configured to receive a discrimination signal and determine the number of divisions by the value of the discrimination signal.

According to a second aspect of the present invention, there is provided a sampling frequency reproduction system comprising detection means for detecting the vertical sync period of a video signal and producing a clock of a period 1/N the vertical sync period as a detection signal, delay means for delaying the detection signal, changing the delay amount thereof by a predetermined value in accordance with the discrimination signal and producing a first phase reference point, frequency divider means for dividing the frequency of the clock of voltage-controlled oscillation means, switching the number of divisions to a predetermined value in accordance with the discrimination signal and producing a second phase reference point, phase comparator means for producing a phase error signal as a time difference between the first and second phase reference points converted into a voltage, band-limiting means for limiting the phase error signal by a predetermined frequency band and producing a control signal, and voltage-controlled oscillation means for controlling the oscillation frequency of the clock produced by the control signal to a predetermined value.

The above-mentioned configuration has novel features in that:

(1) A sampling frequency Fs of a digital audio signal may be generated from the vertical sync signal of a video signal or a head-switching signal, neither having a relationship in an integral ratio with Fs; and (2) A jitter dampened sampling frequency Fs may be produced by delaying the clock having a period 1/N the vertical sync period and changing the amount of delay according to the value of a discrimination signal.

BRIEF DESCRIPTION OF THE DRAWINGS

FIG. 2 is a block diagram showing a configuration of a sampling frequency reproduction system according to a first embodiment of the present invention.

FIG. 3A and FIG. 3B are a timing chart showing signal waveforms of the same system, FIG. 3A corresponds to the left-half portion of the timing chart and FIG. 3B corresponds to the right-half portion thereof.

FIG. 4 is a block diagram showing a general configuration of a sampling frequency reproduction system according to the first embodiment of the present invention.

FIG. 6A and FIG. 6B are the left-half portion and right-half portion of a single timing chart showing signal waveforms of the same system, respectively.

FIG. 7 is a block diagram showing a general configuration of a sampling frequency reproduction system according to the second embodiment of the present invention.

FIG. 8 is a block diagram showing a selector used for a sampling frequency reproduction system according to the present invention.

DESCRIPTION OF THE PREFERRED EMBODIMENTS

Figure 1:
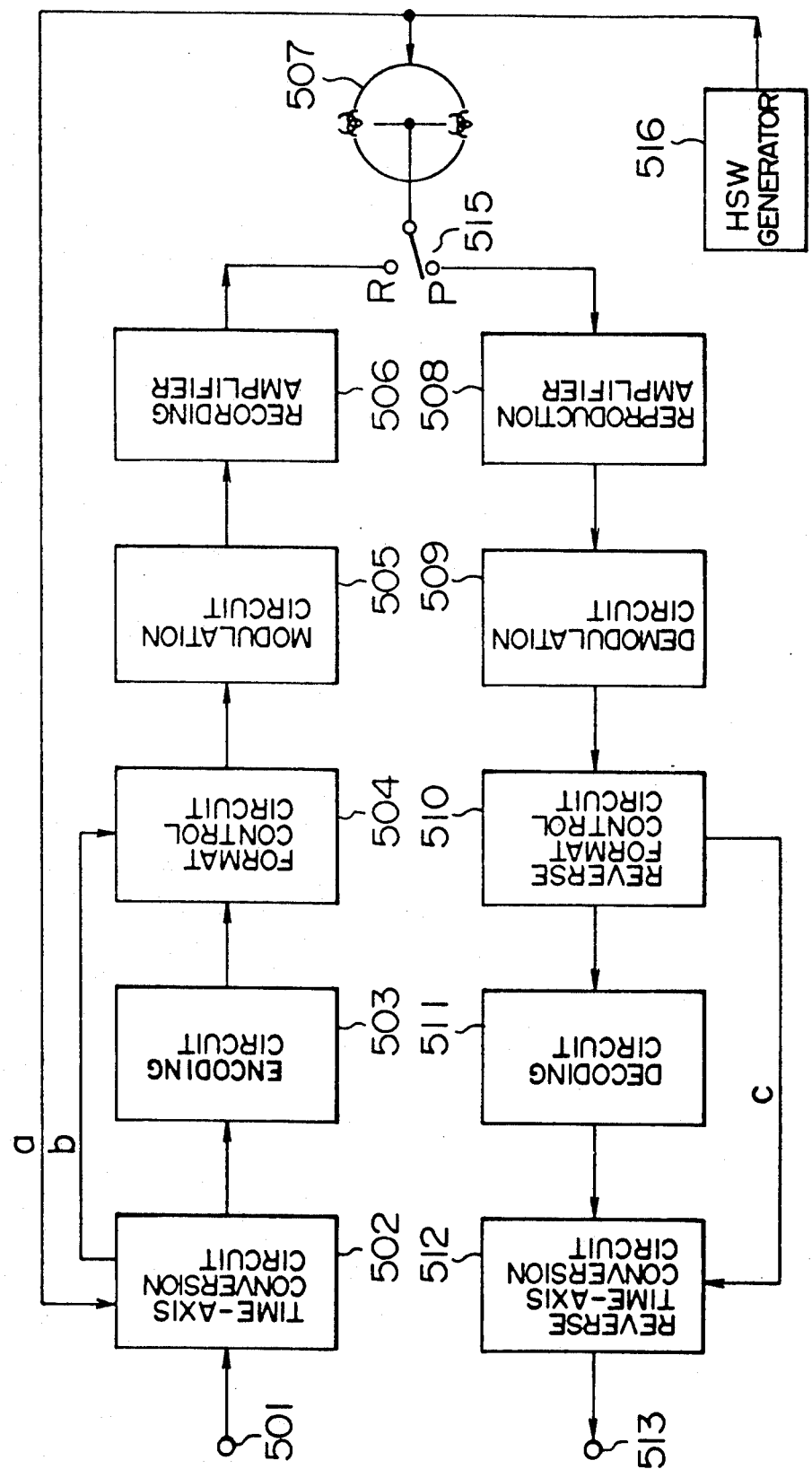
FIG. 1 is a block diagram showing a conventional digital signal processing system.

A sampling frequency reproduction system according to a first embodiment of the present invention will be explained below with reference to the accompanying drawings.

FIG. 2 is a block diagram showing a sampling frequency reproduction system 100 according to a first embodiment of the present invention corresponding to a reverse time axis conversion circuit of a conventional digital signal processing system. FIGS. 3A and 3B are a diagram showing a timing of signal processing in the embodiment of FIG. 2, FIG. 3A is the left-half portion and FIG. 3B is the right-half portion of the chart, and FIG. 4 shows a simplified configuration of a sampling frequency reproduction system according to the first embodiment configured in FIG. 2. In FIGS. 2, 3A, 3B and 4, reference character a designates a head-switching pulse (HSW pulse) adapted to be reversed for each vertical sync period of a video signal, and character b a digital audio signal having the sampling frequency Fs transmitted in the following number of sample pulses [Fs/Fv]+An or [Fs/Fv]−Bn (n: Given value from 0 to k; n, k, An, Bn: predetermined integer; [] indicates an integer) for each vertical sync period of the video signal while being controlled to a sampling frequency as an Fs average transmission rate. Character c designates a write clock in synchronism with the digital audio signal b, and character d a discrimination signal for discriminating the number of sample pulses of the digital audio signals b transmitted for each vertical sync period. Numeral 101 designates a memory for storing the digital audio signal b applied thereto at the timing of the write clock c and reading the same signal at the timing of a read clock c produced from a VCO 108 and numeral 102 a selector supplied with the discrimination signal d for producing a value e corresponding to the numeral value of the digital audio signal pulses transmitted for each vertical sync period corresponding to the discrimination signal d. Numeral 103 designates a latch circuit for latching the selector output by a coincidence detection output g of a comparator 104 described below, and numeral 104 a comparator for comparing the value h produced from the latch circuit 103 with the value f produced from a counter 105 described below and producing a coincidence detection output when the two inputs coincide with each other. Numeral 105 designates a counter for counting the read clock n produced from a VCO 108 described below and cleared by the coincidence detection output g produced from the comparator 104, and numeral 106 a phase comparator for comparing an output i of a flip-flop 110 described below with the phase of the HSW pulse a and producing a phase error voltage j. Numeral 107 designates a low-pass filter supplied with the phase error voltage j for producing the same voltage limited to a predetermined band, and numeral 108 a voltage-controlled oscillator (VCO) supplied with the output of the low-pass filter 107 as a control voltage for producing a clock signal n of predetermined frequency. Numeral 110 designates a flip-flop supplied with the coincidence detection output g for reversing the output i each time of application of the coincidence detection output g thereto, and numeral 111 a reset circuit. Character m designates a digital audio signal produced from the memory 101, character n a read clock produced from the VCO 108, character k a phase comparison window, $l_0$ a starting point, character r a reset output, numeral 601 a frequency divider circuit including the selector 102, the latch circuit 103, the comparator 104, the counter 105 and the flip-flop 110 in FIG. 2.

The operation of the sampling frequency reproduction system configured as described above will be explained with reference to FIGS. 2, 3A, 3B and 4.

First, a digital audio signal of the sampling frequency Fs is transmitted which has the following number of sample [Fs/Fv]+An or [Fs/Fv]−Bn (n: 0 to k; n, k, An Bn: predetermined integers; [ ] indicates an integer) for each vertical sync period of the video signal having a vertical sync frequency Fv, and is controlled to having a sampling frequency Fs as an average transmission rate. The digital audio signal b is applied to a memory 101 at a timing of the write clock c in synchronism with the digital audio signal b. When Fs=48 kHz, and Fv=30/1.00 Hz, for example, [Fs/Fv]=800. If n =0, A0=10 and B0=8, the number of digital audio signal pulses transmitted for each vertical sync period is 810 or 792. The discrimination signal d is applied to the selector 102 as a high-level (hereinafter abbreviated as "H") signal for the time period that the 810 sample pulses of the digital audio signal are transmitted for each vertical sync period and as a low-level (hereinafter abbreviated as "L") signal for the time period that the 792 sample pulses of the digital audio signal are transmitted. The selector 102 produces a value e as 809 for the discrimination signal d of H level and of 791 for the discriminating signal d of L level. At the time of energization of the sampling frequency reproduction system, the reset circuit 111 produces a reset output r at a starting point $l_0$ a predetermined time after the trailing edge of the HSW pulse a. The reset output r clears the counter 105, and the latch circuit 103 latches the value e of the selector 102 applied thereto, and an L signal is produced at the output i of the flip-flop 110. The output f of the counter 105, the output h of the latch circuit 103 and the output i of the flip-flop 110 at the starting point $l_0$ are shown as f, h and i respectively in FIG. 3A.

The counter 105 begins to count the read clock n produced by the VCO 108 from the starting point $l_0$, and the count value f thereof is produced. The comparator 104 is supplied with the count value f and the output h of the latch circuit 103, and when the two inputs coincide with each other, produces a coincidence detection output g. An example of the coincidence detection output g is shown by g in FIG. 3A and FIG. 3B.

At the timings $l_1$, $l_2$, $l_3$ ... of the fall of the coincidence detection output g, the counter 105 is reset, and the latch circuit 103 latches the output value e of the selector 102, thus producing an output h. The flip-flop 110 inverts the output i of the flip-flop 110. This process of operation is repeated. The resulting counter output f, the coincidence detection output g, the latch output h and the output i of the flip-flop 110 are shown in FIGS. 3A and 3B.

The phase comparator 106 is supplied with the output i of the flip-flop 110 and the HSW pulse a and produces the phase comparison output j. The phase comparison output j may be an exclusive logic sum of the output i of the flip-flop 110 and the HSW pulse a. An example of the phase comparison output j is shown in FIGS. 3A and 3B.

The low-pass filter 107 is supplied with the phase comparison output j and produces a signal limited in band as predetermined. The VCO 108 produces a read clock n of frequency Fs when the output voltage of the low-pass filter 107 takes a central value. When the output voltage of the low-pass filter 107 applied to the VCO 108 increases, the frequency of the clock produced also increases, and vice versa.

The phase locked loop including the phase comparator 106, the low-pass filter 107, the VCO 108, the counter 105, the comparator 104 and the flip-flop 110 is such that if the phase of the output i of the flip-flop 110 is delayed behind the HSW pulse a, the H-level period of the phase comparison output j of the phase comparator 106 increases. The frequency of the read clock n of the output of the VCO 108 thus increases, the counter operation is accelerated, the next coincidence detection output g is produced earlier, and the output of the flip-flop 110 is inverted in a state advanced from the previous time. If the phase of the output i of the flip-flop 110 is advanced from that of the HSW pulse a, on the other hand, the L-level period of the phase comparison output of the phase comparator 106 increases. The read clock n of the output of the VCO 108 decreases in frequency, the counter operation is decelerated, the next coincidence detection output g is produced later, and the output of the flip-flop 110 is inverted in a state delayed from the previous time. In this way, the phase locked loop tends to lock the HSW pulse a and the output of the flip-flop 110 at a predetermined phase.

When the coincidence detection signal g is produced during an L-period of the phase comparison window k produced from the HSW pulse a in the reset circuit 111, the phase of the HSW pulse a is detected as being considerably displaced from that of the output i of the flip-flop 110, and the operation at the starting point $l_0$ is restored.

As explained above, according to a first embodiment of the present invention, it is possible to derive the read clock signal having the frequency Fs from the output of the VCO 108 by switching the count of the counter 105 by means of the selector 102. If the band-limiting frequency of the low-pass filter 107 and the proportion of frequency variations of the output clock against the input voltage fluctuations of the VCO 108 are set appropriately, the read clock n of stable frequency Fs may be obtained with few jitter components.

A sampling frequency reproduction system according to a second embodiment of the present invention will be explained with reference to the accompanying drawings.

Figure 5:
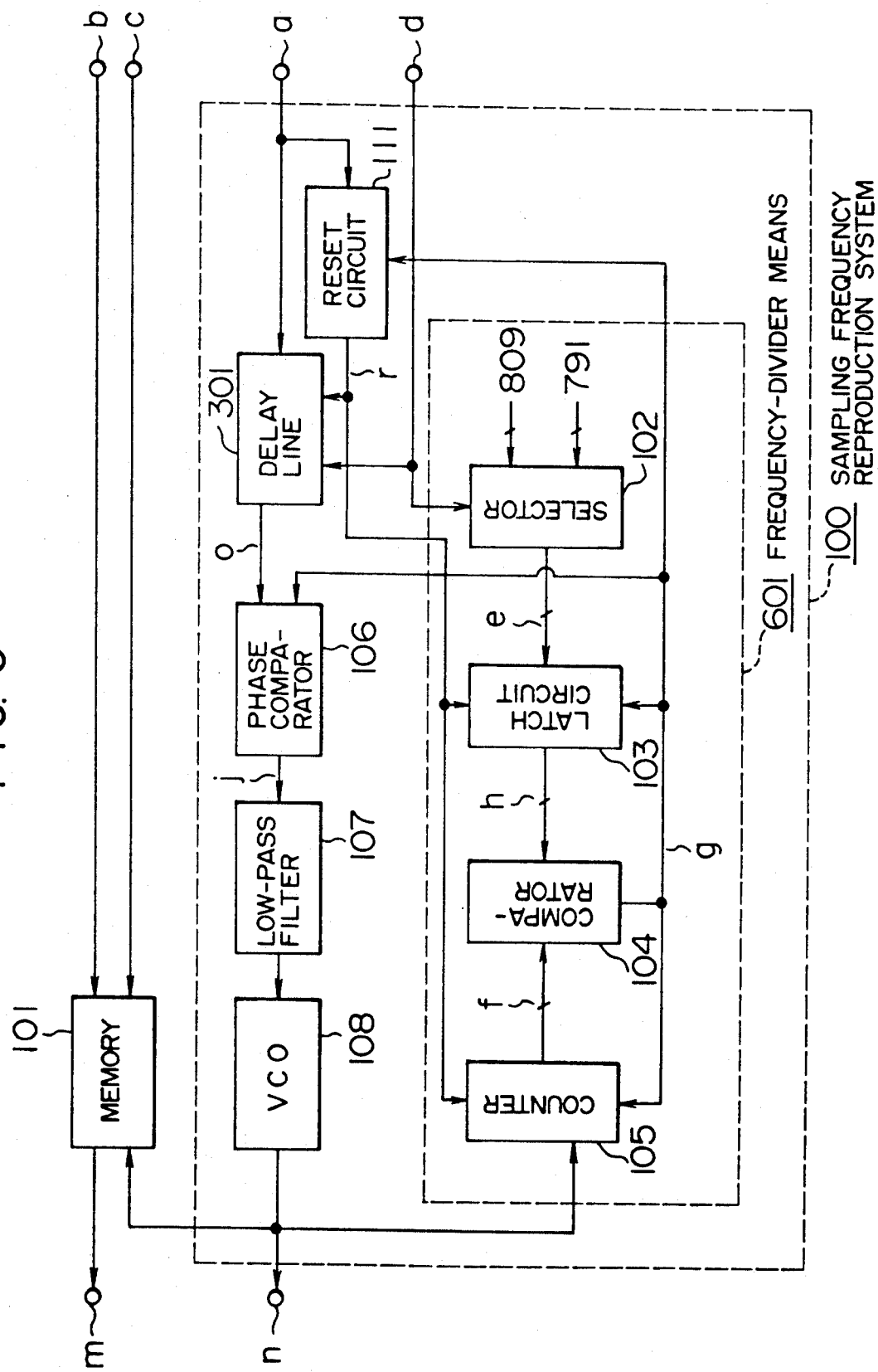
FIG. 5 is a block diagram showing a configuration of a sampling frequency reproduction system according to a second embodiment of the present invention.
Figure 6B:
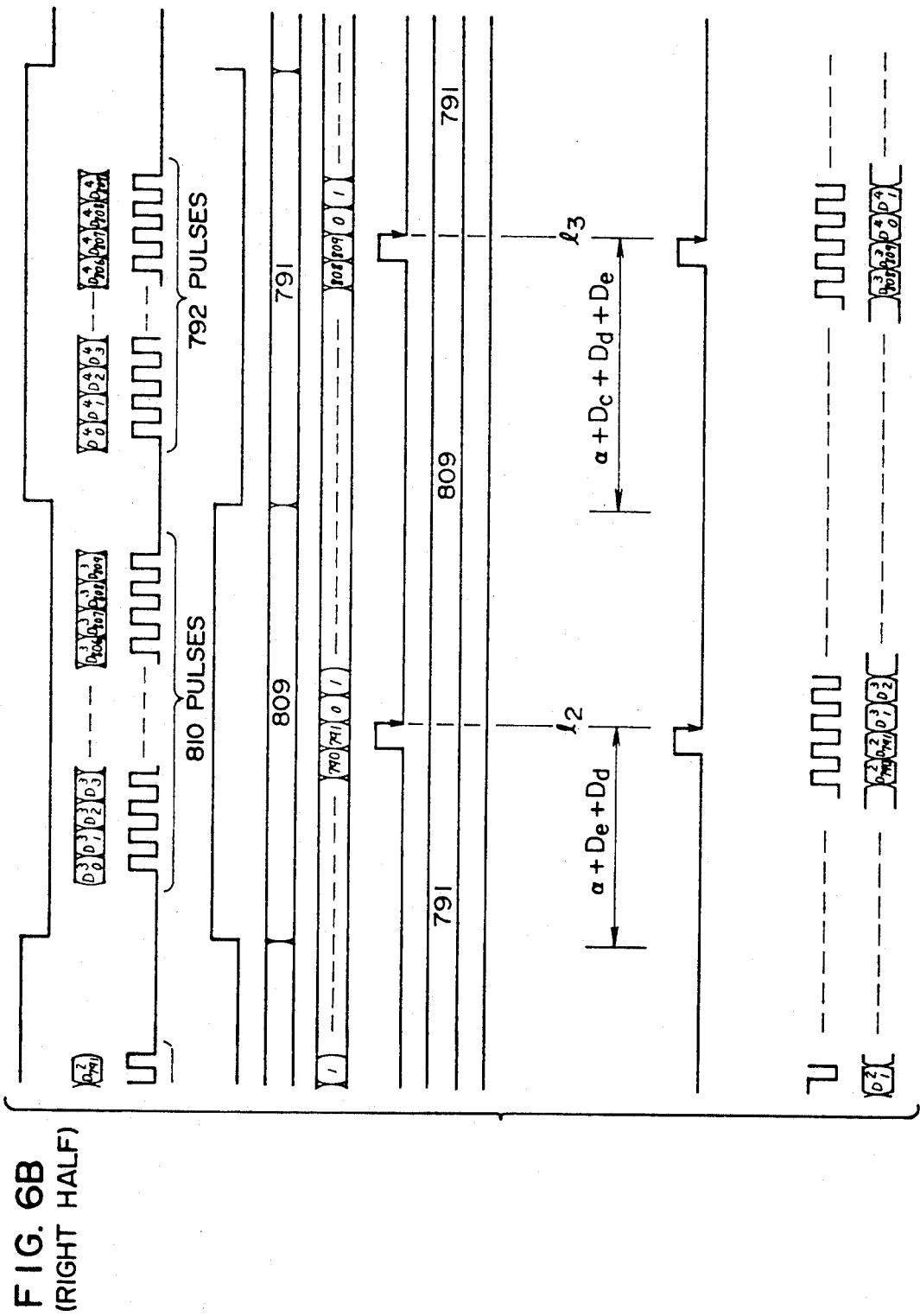

FIG. 5 is a diagram showing a sampling frequency reproduction system according to a second embodiment of the present invention corresponding to the reverse time axis conversion circuit 512 of a conventional digital signal processing system. FIG. 6A and FIG. 6B are a diagram showing a timing of signal processing in FIG. 5. FIG. 7 shows a simplified configuration of a sampling frequency reproduction system 100 according to the second embodiment of the present invention in FIG. 5. In FIGS. 6A and 6B, character a designates a head-switching pulse (HSW pulse) reversed for each vertical sync period of a video signal, and character b a digital audio signal of the sampling frequency Fs transmitted in the number of [Fs/Fv]+An or [Fs/Fv]−Bn (n: 0 to k; n, k, An, Bn: predetermined integer; [ ] indicates an integer) for each vertical sync period of the video signal of the vertical sync frequency Fv and controlled to be Fs in average transmission rate. Character c designates a write clock synchronous with the digital audio signal b, and character d a discrimination signal for discriminating the number of digital audio signal pulses b transmitted for each vertical sync period. Numeral 101 designates a memory supplied with the digital audio signal b for writing at the timing of the write clock and reading at the timing of the read clock n produced from the VCO 108 described below. Numeral 102 designates a selector supplied with the discrimination signal d for producing a value e corresponding to the number of the digital audio signal transmitted for each vertical sync period corresponding to the discrimination signal, numeral 103 a latch circuit for latching the selector output e by the coincidence detection output g of the comparator 104 described below, numeral 104 a comparator for comparing the value h produced from the latch circuit 103 with the value f produced from the counter 105 and producing a coincidence detection output g when the two inputs coincide with each other, numeral 105 a counter for counting the write clock n produced from the VCO 108 described below, which is cleared by the coincidence detection output g produced from the comparator 104, numeral 301 a delay circuit supplied with the discrimination signal d and the HSW pulse a for delaying the HSW pulse a by a predetermined length of time and producing the HSW pulse with a delay time changed in accordance with the value of the discrimination signal d, numeral 106 a phase comparator for comparing the coincidence detection output g of the comparator 104 with the phase of the output o of the delay circuit 301 and producing a phase error voltage j, numeral 107 a low-pass filter supplied with the phase error signal j for producing the same signal in a predetermined limited band, numeral 108 a voltage-controlled oscillator (VCO) supplied with an output of the low-pass filter 107 as a control voltage for producing a clock of a predetermined frequency, character m a digital audio signal produced from the memory 101, character n a read clock produced from the VCO 108, character $l_0$ a starting point, characters $l_1$, $l_2$, $l_3$ first, second and third phase comparison points respectively, and character r a reset output.

The operation of a sampling frequency reproduction system configured as mentioned above will be explained below with reference to FIGS. 5, 6A, 6B and 7.

First, a digital audio signal of a sampling frequency Fs is transmitted in the number of [Fs/Fv]+An and [Fs/Fv]−Bn (n: 0 to k; n, k, An, Bn: Predetermined integer; [ ] indicates an integer) for each vertical sync period of a video signal having vertical sync frequency Fv and controlled to be Fs in average transmission rate. The digital audio signal b thus transmitted is applied to the memory 101 at a timing of the write clock c in synchronism with the digital audio signal b. Assuming that Fs=48 kHz, and Fv=30/1.001 Hz. [Fs/Fv]=800. If A0=10, B0 =8 and n=0, the number of the digital audio signal transmitted for each vertical sync period is either 810 or 792 sample pulses. The discrimination signal d is applied to the selector 102 as a H-level signal when the number of digital audio sample pulses signals transmitted for each vertical sync period is 810 sample pulses and as a L-level signal when such number is 792 sample pulses. The selector 102 produces a value e representing 809 sample pulses in response to H-level of the discrimination signal and 791 sample pulses in response to L-level of the same signal. At the time of starting the sampling frequency reproduction system, the reset circuit 111 produces a reset output r at a starting point $l_0$ a predetermined time α after the trailing edge of the HSW pulse. The reset output r clears the counter 105, and causes the latch circuit 103 to latch the value e of the selector 102 applied thereto. The output f of the counter 105 and the output h of the latch circuit 103 at the starting point $l_0$ are shown as f and h, respectively in FIG. 6A.

The counter 105 begins to count the read clock n produced from the VCO 108 from the starting point $l_0$, and produces the count f. The comparator 104, which is supplied with the count f and the output h of the latch circuit 103, produces a coincidence detection output g when the two inputs coincide with each other. An example of the coincidence detection output g is shown in g of FIGS. 6A and 6B.

The counter 105 is reset at timings $l_1$, $l_2$, $l_3$, and so on, at the fall of the coincidence detection output g, and the latch circuit 103 repeats the operation of latching the output value e of the selector 102 and producing the output h. The resulting counter output f, the coincidence detection output g and the latch output h are shown in FIGS. 6A and 6B.

The delay circuit 301 is supplied with the HSW pulse a and produces an output g a predetermined delay time t after the reverse edge of the HSW pulse a.

The phase relationship between the HSW pulse and the coincidence detection output g is such that the coincidence detection output g is delayed behind the HSW pulse a by De=(810−800.8)/48k=0.19 msec when the counter 105 counts 809, and by Dd=(792−800.8)/48 k=−0.18 msec when the counter 105 counts 792. If the output o of the delay circuit 301 is controlled in such a manner that the delay time t may be t=α+ΣDi (Σ: Accumulation from start; Di: De or Dd), for instance, the output o of the delay circuit 301 coincides in timing with the coincidence detection output g to the extent that the frequency Fv of the HSW pulse a has no error from 30/1.001 Hz or the read clock n produced from the VCO 108 is not displaced from Fs =48 kHz.

An example of the delay time t with the discrimination signal d transmitted in the form of H, L, H, and so on from the starting time is shown in FIG. 5.

At the first phase comparison point $l_21$, t=α+De, at the second phase comparison $l_2$, t=α+De+Dd, and at the third phase comparison point $l_3$, t=α+De+Dd+De.

The phase comparator 106, which is supplied with the output o of the delay circuit 301 and the coincidence detection output g of the comparator 104, produces a voltage proportional to the time difference between them as a phase error voltage j. When the output o of the comparator 301 and the coincidence detection output g have a time difference of zero, for example, the phase error voltage j is produced as a central voltage V0, while if the coincidence detection output g is delayed behind the output o of the comparator 301, the phase error voltage j is increased from the central voltage V0 in proportion to the time difference. Similarly, when the output o of the delay circuit 301 is delayed behind the coincidence detection output g, the phase error voltage j is decreased from the central voltage V0 in proportion to the time difference therebetween.

The low-pass filter 107 is supplied with the phase error voltage j and produces the same signal limited in band. The VCO 108 produces a clock of a frequency Fs=48 kHz when the output voltage of the low-pass filter 107 applied thereto is the central voltage V0, and if the output voltage of the low-pass filter 107 increases, the frequency of the clock produced is also increased, and vice versa.

In this way, a phase locked loop is configured of the phase comparator 106, the low-pass filter 107, the VCO 108, the counter 105, the comparator 104 and the delay circuit 301.

As described above, according to the second embodiment of the present invention, the output g of the delay circuit 301 is produced as a signal delayed by the delay time t from the reversed edge of the HSW pulse and is controlled in such a manner that $t = \alpha + \Sigma Di$ ($\Sigma$: Accumulation from starting time; $Di$: $De$ or $Dd$, where $De = (810 - 800.8)/48$ $k = 0.19$ msec, and $Dd = (792 - 800.8)/48$ $k = 0.18$ msec). To the extent that the HSW pulse a has no error from $Fv = 30/1.001$, it is possible to reproduce the read clock n of Fs=48 kHz without any period error from the VCO 108.

According to the first and second embodiments of the present invention, n=0, A0=10 and B0=8, that is to say, a digital audio signal in two different sample numbers of 810 and 792 are recorded and reproduced for each head-produced switching period. As an alternative, if a digital audio signal in four different sample pulse numbers of 810, 805, 797 and 792 are recorded and reproduced for each head-switching period by setting n to 1, A0 to 10, A1 to 5, B0 to 8 and B1 to 3, for example, the selector 102 requires a configuration of a second selector as shown in FIG. 8. The second selector produces a value e corresponding to the four different sample pulse numbers of the digital audio signal recorded for each head-switching period by the discrimination signal d.

(1) As explained above, there is provided according to one aspect of the present invention a sampling frequency reproduction system comprising phase comparator means supplied with a reference signal and an output of frequency divider means producing a phase error signal representing the phase difference between them, band-limiting means for limiting the phase error signal to a predetermined frequency band and producing a control signal, voltage-controlled oscillator means for controlling the oscillation frequency of the clock produced by the control signal, and frequency divider means for frequency-dividing the clock by a predetermined number and producing the same clock, wherein the frequency-divider means is supplied with a discrimination signal and determines the number of frequency divisions in accordance with the value of the discrimination signal thereby to reproduce a sampling frequency having no relationship of an integral ratio with the reference signal.

(2) According to a second aspect of the present invention, there is provided a sampling frequency reproduction system Comprising delay mean for delaying a reference signal, changing the delay amount by a predetermined value in accordance with a discrimination signal and producing a first phase comparison point, phase comparator means supplied with the first phase comparison point and an output of frequency divider means described later to produce the phase difference between them as a phase error signal, band-limiting means for limiting the frequency band of the phase error signal and producing a control signal, voltage-controlled oscillation means for controlling the oscillation frequency of the clock produced by the control signal, and frequency-divider means for frequency-dividing the clock by a predetermined number and producing the same, wherein the frequency-divider means determines the number of frequency divisions in accordance with the value of a discrimination signal applied thereto and reproduces a sampling frequency having no relationship of integral ratio with the reference signal. The sampling frequency thus reproduced has no period error to the extent that the reference signal has no period error.

We claim:

1. A sampling frequency reproduction system, comprising:

frequency dividing means, receiving a first clock signal and a discrimination signal which indicates a predetermined number, for generating a second clock signal the frequency of which is determined by a time period required for a number of pulses of said first clock signal to reach said predetermined number;

phase comparison means, receiving a reference signal and said second clock signal, for producing a phase error signal representing a phase difference between said reference signal and said second clock signal; band limiting means for receiving said phase error signal and outputting a control signal which is said phase error signal limited to a predetermined frequency band; and voltage controlled oscillation means for receiving said control signal and for outputting a signal constituting said first clock signal at a frequency determined by said control signal.

2. The system as in claim 1, wherein said reference signal is a video head switching pulse signal and said discrimination signal is a signal representing a number of digital audio sampling signals contained in a reproduced signal of each track of a record medium.

3. A sampling frequency reproduction system, comprising:

frequency dividing means, receiving a first clock signal and a discrimination signal which represents a predetermined number, for generating a delay signal representing a variable delay value;

delay means, receiving a reference signal and said discrimination signal, for providing a delayed output which is said reference signal delayed an amount determined by said discrimination signal;

phase comparison means, receiving said delayed output from said delay means and said delay signal from said frequency dividing means, for producing a phase error signal representing a phase difference between said delayed output and said delay signal;

band limiting means for receiving said phase error signal and outputting a control signal which is said phase error signal limited to a predetermined frequency band; and voltage controlled oscillation means for receiving said control signal and for outputting a signal constituting said first clock signal at a frequency determined by said control signal.

4. The system as in claim 3, wherein said reference signal is a video head switching pulse signal and said discrimination signal is a signal representing a number of digital audio sampling signals contained in a reproduced signal of each track of a record medium.

5. A sampling frequency reproduction system for use in a method of transmitting a digital audio signal having a sampling frequency Fs having a value of (Fs/Fv)+An and (Fs/NFv)−Bn, where Fv is a vertical sync frequency of a video signal, n is a value from 0 to k, ( ) indicates an integer, and n, k, An and Bn are predetermined integers, for each 1/N, where N is a predetermined integer or fraction, or a vertical sync period of the video signal of vertical sync frequency Fv and controlling the digital audio signal to have said sampling frequency Fs as its average transmission rate, said digital audio signal being transmitted together with a discrimination signal for discriminating a number of digital audio signal samples transmitted for each 1/N of the vertical sync period, said system comprising:

memory means for storing said digital audio signal which is read out therefrom at a timing determined by a read clock signal;

detection means for detecting the vertical sync period of the video signal and for producing a detection signal having a period which is 1/N of the vertical sync period of the video signal;

phase comparison means, receiving a reference signal and said detection signal, for producing a phase error signal representing a phase difference between said reference signal and said detection signal;

band limiting means for receiving said phase error signal and outputting a control signal which is said phase error signal limited to a predetermined frequency band;

voltage controlled oscillation means for receiving said control signal and for outputting a an oscillation signal having a frequency determined by said control signal;

counter means for receiving said read clock signal and for providing a count value representing a number of pulses in said clock signal;

selection means for receiving the discrimination signal and for providing a selection value representing a number of digital audio signal samples transmitted each 1/N of the vertical sync period in response to said discrimination signal;

latch means for receiving the selection value and providing a latched signal corresponding to said selection value at a latching time point;

comparison means, receiving said count value and said latched signal, for providing a coincidence detection signal when said count value and said latch signal coincide with one another; and a flip flop receiving said coincidence detection signal and providing an output signal which is switched between a high level and a low level each time said coincidence detection signal is applied to said flip flop; said output signal of said flip flop constituting said reference signal received by said phase comparison means; said count value of said counter means being cleared upon each occurrence of said coincidence detection signal output by said comparison means; and said latch means latching said selection value upon each occurrence of said coincidence detection signal output by said comparison means.

6. A sampling frequency reproduction system for transmitting a digital audio signal having a sampling frequency Fs having a value of (Fs/Fv)+An and (Fs/NFv)−Bn, where Fv is a vertical sync frequency of a video signal, n is a value of 0 to k, ( ) indicates an integer, and n, k, An and Bn are predetermined integers, for each 1/N, where N is a predetermined integer or fraction, of a vertical sync period of the video signal of vertical sync frequency Fv and controlling the digital audio signal to have said sampling frequency Fs as its average transmission rate, said digital audio signal being transmitted together with a discrimination signal for discriminating a number of digital audio signal samples transmitted for each 1/N of the vertical sync period, said system comprising:

memory means for storing said digital audio signal which is read out therefrom at a timing determined by a read clock signal;

detection means for detecting the vertical sync period of the video signal and for producing a detection signal having a period which is 1/N of the vertical sync period of the video signal;

delay means, receiving said detection signal and said discrimination signal, for providing a delayed output which is said detection signal delayed by one of a plurality of predetermined delay values as determined by said discrimination signal, said delayed output providing a first phase comparison point signal;

frequency dividing means, receiving said discrimination signal and said read clock signal and having a plurality of predetermined division values which are selectable in response to the discrimination signal, for dividing a frequency of the read clock signal and for switching the magnitude of the frequency divisions to a selected on of said predetermined division values in accordance with said discrimination signal to produce a second phase comparison point signal;

phase comparison means, receiving said first phase comparison point signal and said second comparison point signal, for producing a phase error signal representing a time difference between said first phase comparison point signal and said second phase comparison point signal, said phase error signal being a voltage signal;

band limiting means for receiving said phase error signal and outputting a control signal which is a phase error signal limited to a predetermined frequency band; and voltage controlled oscillation means for receiving said control signal and for outputting a signal constituting said read clock signal at a frequency determined by said control signal.

* * * * *